United States Patent
Sugihashi

[11] Patent Number: 5,959,470
[45] Date of Patent: Sep. 28, 1999

[54] OPERATIONAL AMPLIFIER WITH TWO SAMPLE AND HOLD CIRCUITS

[75] Inventor: Fujihiko Sugihashi, Kashiwa, Japan

[73] Assignee: Texas Instruments Incorporated, Dallas, Tex.

[21] Appl. No.: 08/917,994

[22] Filed: Aug. 25, 1997

[51] Int. Cl.[6] .................................................. G11C 27/02
[52] U.S. Cl. ............................................ 327/94; 327/91
[58] Field of Search .................................. 327/91, 93, 94, 327/96, 52, 53; 330/253, 257; 341/122

[56] References Cited

U.S. PATENT DOCUMENTS

| | | | |
|---|---|---|---|
| 3,702,942 | 11/1972 | Aguirre | 327/94 |
| 5,343,089 | 8/1994 | Itakura et al. | 327/94 |
| 5,349,245 | 9/1994 | Hughes et al. | 327/94 |

*Primary Examiner*—My-Trang Nu Ton
*Attorney, Agent, or Firm*—William B. Kempler; Richard L. Donaldson

[57] ABSTRACT

The objective of the present invention is to provide a type of sample-and-hold circuit free of the influence of parasitic capacitors.

In the sampling state, charging/discharging are performed for hold capacitor $C_{H1}$ at the sampling voltage, and, in the holding state, hold capacitor $C_{H1}$ is cut off from the input voltage. Current flows through MOSFET 54 connected to hold capacitor $C_{H1}$ for operation, and a voltage corresponding to the hold voltage is output. Nearly the same current flows through MOSFET 54 in the sampling state and the holding state, and the voltage variation at the terminal of MOSFET 54 in transition from the sampling state to the holding state becomes smaller. Consequently, the influence of the parasitic capacitance on the hold voltage can be reduced. As the potentials of the source terminal and the drain terminal of MOSFET 54 become nearly equal, the influence of the parasitic capacitance on the hold voltage can be further reduced. REFERENCE NUMERALS AND SYMBOLS AS SHOWN IN THE DRAWINGS 2 Sample-and-hold circuit; 54, 64 MOSFET; $C_{H1}$, $C_{H2}$ Hold capacitor.

21 Claims, 3 Drawing Sheets

5,959,470

OPERATIONAL AMPLIFIER WITH TWO SAMPLE AND HOLD CIRCUITS

FIELD OF THE INVENTION

The present invention pertains to the technical field of sample-and-hold circuits. In particular, the present invention pertains a type of sample-and-hold circuit with the hold voltage input to the gate terminal of MOSFET.

BACKGROUND OF THE INVENTION

Usually, a sample-and-hold circuit is arranged in the input section of an A/D converter or another converting device. It samples the input voltage with prescribed timing, and then holds the sampled voltage until the end of the conversion operation by the converting device set in the next stage. Of the sample-and-hold circuits of this type, a sample-and-hold circuit having 2 inputs and 1 output is represented by number 102 in FIG. 3.

Said sample-and-hold circuit 102 is mainly made of a differential section and an output section. The differential section consists of constant-current source 141 made up of a p-channel MOSFET, 2 systems of differential blocks 151 and 161 having 2 sampling voltages $V_{in1}$ and $V_{in2}$ input to them, respectively, and current mirror 143 made up of n-channel MOSFETs 144, 145.

The output section consists of constant-current source 142 made up of a p-channel MOSFET and output transistor 147 made up of an n-channel MOSFET.

Said 2 systems of differential blocks 151 (first system) and 161 (second system) have switches 152, 162 and differential circuits 153, 163 made of p-channel MOSFETS. Said differential circuits 153 and 163 are connected to the same constant-current source 141 through switches 152 and 162.

Signal $XSEL_1$ and signal $XSEL_2$, which have opposite logic levels, are input to the gate terminals of switches 152 and 162. Only one of these switches is on. Consequently, when current is fed to one of the differential circuits, the current is not fed to the other differential circuit.

Said differential circuit 153 of the first system is made of p-channel MOSFETs 154 and 155 with a common source terminal. Said differential circuit 163 of the second system is made of p-channel MOSFETs 164 and 165 with a common source terminal. One end of hold capacitor $C_{H1}$ of differential block 151 and one end of hold capacitor $C_{H2}$ of differential block 161 are connected to the gate terminals of p-channel MOSFETs 154 and 164, respectively.

Said differential circuits 153 and 163 of the first and second systems have a constitution such that current mirror 143 is the shared load and they drive the same output transistor 147. The output terminal of output transistor 147 is connected to the gate terminals of p-channel MOSFETs 155 and 165, each of which is one p-channel MOSFET of differential circuits 153 and 163, respectively. One end of each of the hold capacitors $C_{H1}$ and $C_{H2}$ of the first and second systems is connected to the gate terminals of each of p-channel MOSFETs 154 and 164.

Switches $SW_1$ and $SW_2$ are set at one end of each of hold capacitors $C_{H1}$ and $C_{H2}$ and the connection middle points of the gate terminals of p-channel MOSFETs 154 and 164. When switches $SW_1$ and $SW_2$ are on, charging/discharging takes place for hold capacitors $C_{H1}$ and $C_{H2}$ at voltages $V_{in1}$ and $V_{in2}$ for sampling.

Now suppose switch $SW_1$ on the side of differential block 151 of the first system is on, and switch 152 in differential block 151 is off, switch $SW_2$ on the side of differential block 161 of the second system is off, and switch 162 in differential block 161 is on. In this case, on hold capacitor $C_{H1}$ of the first system, sampling voltage $V_{in1}$ applied through switch $SW_1$ appears as the hold voltage (sampling operation), and since switch $SW_2$ is off, sampling voltage voltage [sic] $V_{in2}$ is not applied to hold capacitor $C_{H2}$ of the second system (hold operation).

From this state, switch 162 is off, the operation of differential block 161 of the second system stops; then, $SW_1$ is off, hold capacitor $C_{H1}$ of the first system is opened from sampling voltage $V_{in1}$. Then, switch 152 is on, current is fed to differential block 151 of the first system, and the operation of differential circuit 153 in differential block 151 of the first system is started.

Said sample-and-hold circuit 102 is configured as a voltage follower, which outputs the voltage of the hold capacitor in the differential block from the voltages of hold capacitors $C_{H1}$ and $C_{H2}$. Now, as switch 152 of the first system is on, differential circuit 153 of the first system operates. Consequently, hold voltage $V_{CH1}$ of the first system appears, through output transistor 147, as output voltage $V_{out}$.

On the other hand, switch 162 of the second system is off, and differential circuit 163 of the second system stops. In this case, switch $SW_2$ of the second system is on, sampling voltage $V_{in2}$ is applied to hold capacitor $C_{H2}$, and charging/discharging occurs at this voltage.

This state is maintained until the end of the conversion operation of the converter set as the next stage after sample-and-hold circuit 102 to the level of hold voltage $V_{CH1}$ of the first system. Then, switch 152 of the first system is off, and the operation of differential circuit of the first system stops. Then, switch $SW_2$ of the second system is off, and hold capacitor $C_{H2}$ is opened from sampling voltage $V_{in2}$. Then, switch 162 is on, and operation of differential circuit 163 of the second system starts.

As switch 162 is on, operation of p-channel MOSFET 164 connected to hold capacitor $C_{H2}$ of the second system starts. As shown in FIG. 4(a), said p-channel MOSFET 164 has the following constitution: impurities are diffused into a p-type silicon substrate; an n-region (n well) is back gate B; and 2 $p^+$ layers diffused in said back gate B (n well) act as source region S and drain region D. Also, gate electrode G is formed by means of polysilicon film set via a gate oxide film.

In this way, from the constitution shown in FIG. 4(a), in the conventional MOSFET, parasitic capacitors $C_{GB}$, $C_{GS}$, and $C_{GD}$ are formed between gate electrode G and back gate B, between gate electrode G and source region S, and between gate electrode and drain region D, respectively. In said p-channel MOSFET 164, these parasitic capacitors $C_{GB}$, $C_{GS}$, and $C_{GD}$ are connected in the state shown in FIG. 4(b).

One end of each of said parasitic capacitors $C_{GS}$, $C_{GD}$, and $C_{GB}$ and hold capacitor $C_{H2}$ is connected to gate electrode G (gate terminal). Differential block 161 of the second system stops, and p-channel MOSFET 164 is off. In this state, $V_{OUT}$, a voltage identical to hold voltage $V_{CH1}$ of differential block 151 of the first system, is applied to the gate terminal of p-channel MOSFET 165. Consequently, the potential on the side of the source terminal of parasitic capacitors $C_{GS}$ and $C_{GB}$ becomes $V_{CH1}+V_{th}$ (where $V_{th}$ represents the threshold voltage of p-channel MOSFET 165).

Also, since the drain terminal of p-channel MOSFET 164 is connected to the drain terminal of p-channel MOSFET 154, when differential block 151 of the first system operates, the voltage at the drain terminal of p-channel MOSFET 164 becomes potential $V_{X1}$ of the gate terminal when output transistor 147 outputs hold voltage $V_{CH1}$ of the first system. Consequently, the potential on the side of drain of parasitic capacitor $C_{GD}$ is $V_{X1}$.

In this case, the dependence in potential of various parasitic capacitors $C_{GS}$, $C_{GD}$, and $C_{GB}$ on hold capacitor $C_{H2}$ is illustrated in FIG. 4(*c*).

After switch $SW_2$ is off from this state, switch 162 becomes on, and differential circuit 161 of the second system makes transition from the sampling state to the holding state, the supply of current to differential circuit 163 of the second system starts, and the potential of one end of each of the parasitic capacitors $C_{GS}$ and $C_{GB}$ rises from $V_{CH1}+V_{th}$ to the potential of the drain terminal of constant-current source 141. Also, the potential at one end of parasitic capacitor $C_{GD}$ changes from said potential $V_{X1}$ to potential $V_{X2}$ of the gate terminal when output transistor 147 outputs hold voltage $V_{CH2}$ of the second system.

In this way, when the transition from the sampling state to the holding state occurs, the terminal potential of p-channel MOSFET 164 connected to hold capacitor $C_{H2}$ varies. Consequently, current for charging/discharging of parasitic capacitors $C_{GS}$, $C_{GD}$, and $C_{GB}$ flows through hold capacitor $C_{H2}$, the voltage of hold capacitor $C_{H2}$ after transition to the holding state becomes different than the voltage of hold capacitor $C_{H2}$ in the sampling state, and error in the detected voltage takes place.

Among said parasitic capacitors $C_{GS}$, $C_{GD}$, and $C_{GB}$, for parasitic capacitor $C_{GB}$ between the gate and back gate, when power source voltage $V_{ee}$ is applied to back gate B, there is no variation in the sampling state and the holding state. Consequently, it is possible to eliminate its influence.

However, the voltage at the source terminal and drain terminal of the MOSFET connected to the hold capacitor on the side in the sampling state is influenced by the value of output voltage $V_{out}$ output by the other system in the holding state. Consequently, it is impossible to get rid of the influence of parasitic capacitors $C_{GS}$, $C_{GD}$. There is a demand to solve this problem.

The purpose of the present invention is to solve the aforementioned problems of the conventional methods by providing a type of sample-and-hold circuit free of the influence of parasitic capacitance.

SUMMARY OF INVENTION

In order to solve the aforementioned problems, the invention provides a type of sample-and-hold circuit characterized by the following facts: the sample-and-hold circuit has a hold capacitor, and MOSFET whose gate terminal is connected to one end of said hold capacitor; the sample-and-hold circuit has a constitution such that during the sampling state, charging/discharging takes place for said hold capacitor at the sampling voltage; and in the holding state, said hold capacitor is cut off from the sampling voltage, and, since the MOSFET is connected to said hold capacitor, the voltage corresponding to the voltage of said hold capacitor is output through the drain terminal of the MOSFET; in this sample-and-hold circuit, said MOSFET has a constitution such that in said sampling state, a current nearly equal to the current flowing in said holding state flows.

The invention provides a sample-and-hold circuit characterized by the following facts: the sample-and-hold circuit has plural hold capacitors, and plural MOSFETs, whose gate terminals are connected to one end of said hold capacitors; the sample-and-hold circuit has a constitution such that during the sampling state, charging/discharging takes place for said hold capacitors, respectively, at the sampling voltage; and in the holding state, said hold capacitors are cut off from the sampling voltage, and, by means of the operation of the MOSFET selected from the MOSFETs connected to said hold capacitors, the voltage corresponding to the voltage of said hold capacitor is output through the drain terminal of the MOSFET; in this sample-and-hold circuit, said MOSFETs have a constitution such that in said sampling state, a current nearly equal to the current flowing in said holding state flows.

The invention provides the sample-and-hold circuit having the constitution is such that the source terminal of said MOSFET is set at nearly identical potential in said sampling state and in said holding state.

The invention provides the sample-and-hold circuit having the constitution is such that the drain terminal of said MOSFET is set at nearly identical potential in said sampling state and in said holding state.

The aforementioned sample-and-hold circuit of the present invention has the following constitution: it has a hold capacitor and MOSFET whose gate terminal is connected to one end of the hold capacitor. In the sampling state, charging/discharging takes place for said hold capacitor at the sampling voltage. In the holding state, said hold capacitor is cut off from the sampling voltage, and since the MOSFET is connected to said hold capacitor, the voltage corresponding to the voltage of said hold capacitor is output through the drain terminal of the MOSFET. As the hold capacitor and the MOSFET make the transition from the sampling state to the holding state, the voltage input to the hold capacitor during the transition can be sampled and held.

For the MOSFET, the current that flows during the sampling state is nearly equal to the current flowing during the holding state. Consequently, it is possible to make the operating state of the MOSFET during the sampling state and the operation state of the MOSFET during the holding state equal. Consequently, when a transition takes place from the sampling state to the holding state, there is no change in the voltage between terminals of the MOSFET connected to the hold capacitor, and it is possible to prevent charging/discharging of the parasitic capacitance.

The sample-and-hold circuit has plural hold capacitors and plural MOSFETs. In the holding state, each of said hold capacitors is cut off from the sampling voltage, and, by means of the operation of the MOSFET selected from the MOSFETs connected to said cut-off hold capacitors, the voltage corresponding to the voltage of said hold capacitor is output through the drain terminal of the MOSFET. For each MOSFET, the current flowing during the sampling state is nearly equal to that in the holding state. Consequently, it is possible to have the operating state of each MOSFET in the sampling state and the operating state of the MOSFET in the holding state equal. Consequently, when there is a transition from the sampling state to the holding state, it is possible to prevent charging/discharging of the parasitic capacitance, and it is possible to reduce the voltage error of the hold capacitor.

For the source terminal of the MOSFET with its gate terminal connected to the hold capacitor, if the constitution is such that the potential in the sampling state is nearly equal to that in the holding state, when a transition takes place from the sampling state to the holding state, it is possible to eliminate the influence of the parasitic capacitance between the gate and source on the hold capacitor.

In the case when the potential of the source terminal in the sampling state is nearly equal to that in the holding state, if the back gate is short-circuited to the source terminal, even when the potential of the back gate of MOSFET is not clamped at the power source voltage, it is possible to prevent charging/discharging of the parasitic capacitance between the gate and the back gate.

In addition, for the drain terminal of the MOSFET, when the constitution is such that the potential in the sampling state is nearly equal to that in the holding state, when a transition from the sampling state to the holding state occurs, the influence of the parasitic capacitance between the gate and the drain on the hold capacitor can be eliminated.

DESCRIPTION OF EMBODIMENTS

In the following, the present invention will be explained in more detail with reference to embodiments.

Figure 1:
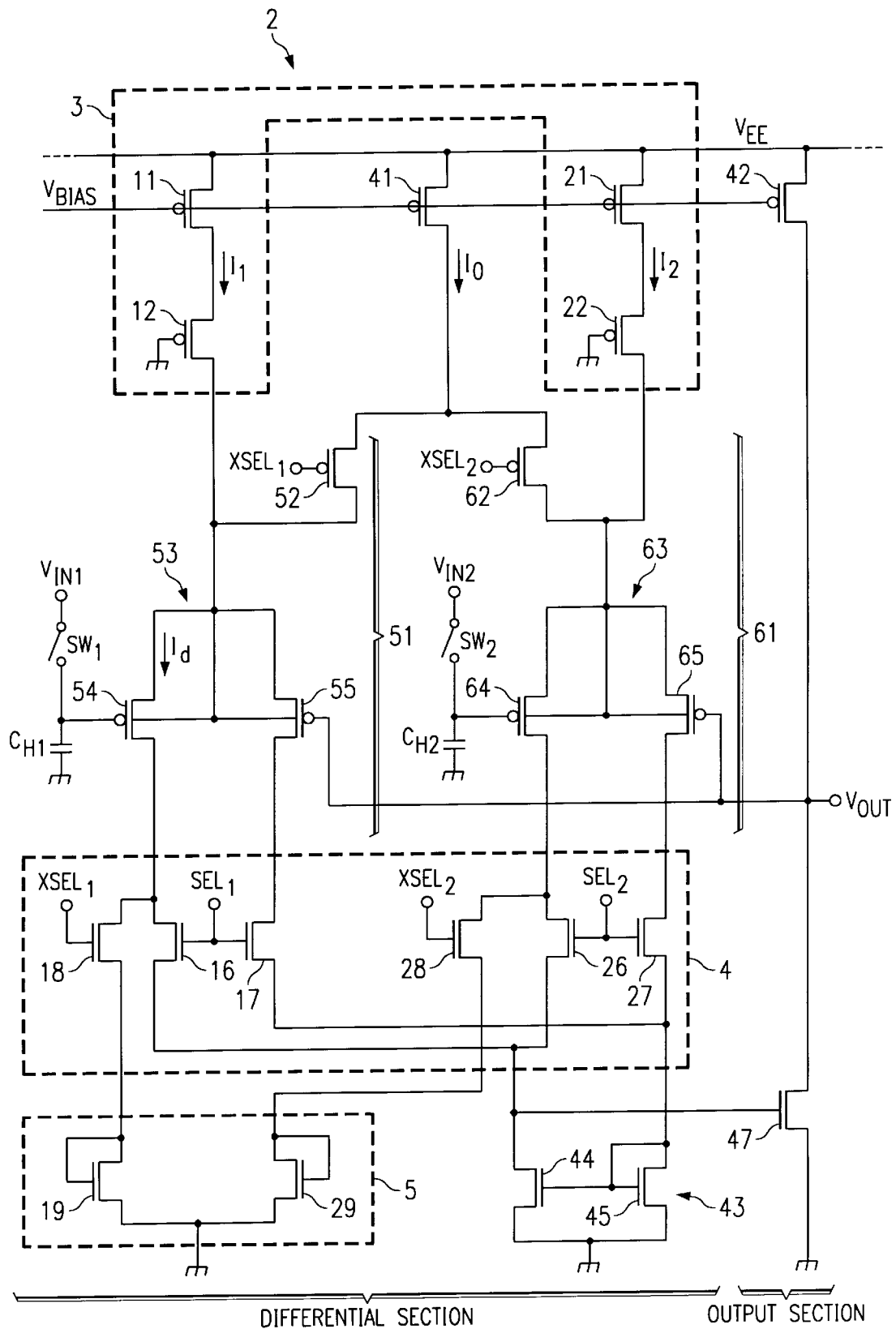
FIG. 1 is a circle diagram illustrating the sample-and-hold circuit as an example of the present invention.
Figure 3:
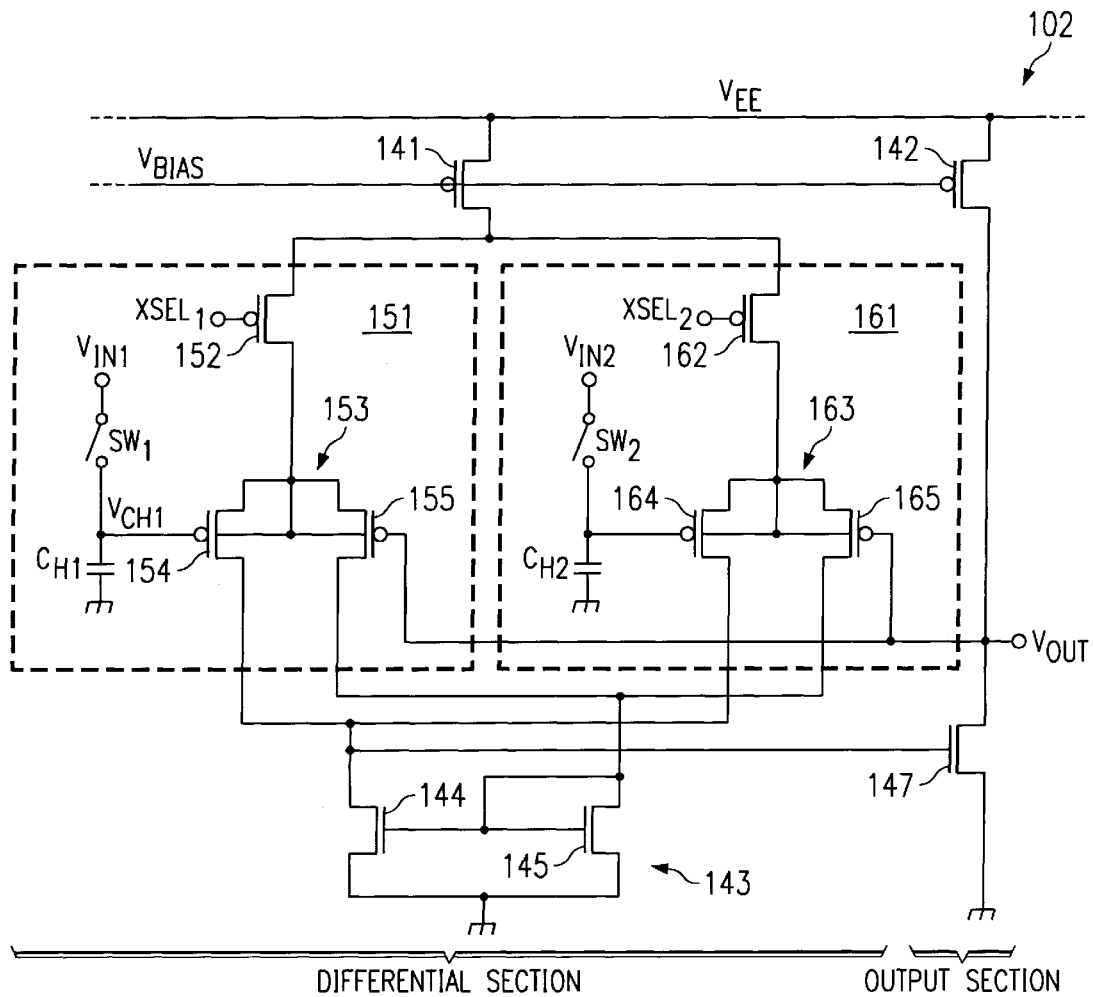
FIG. 3 is a circuit diagram illustrating a conventional sample-and-hold circuit.
Figure 4A:
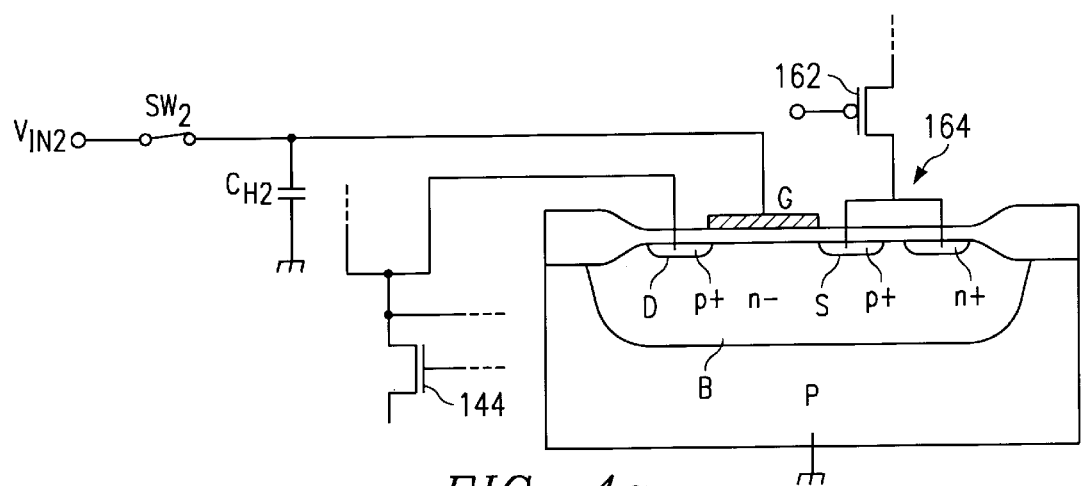
FIG. 4(a) is a cross-sectional view illustrating the diffusion structure of the p-channel MOSFET.
Figure 4B:
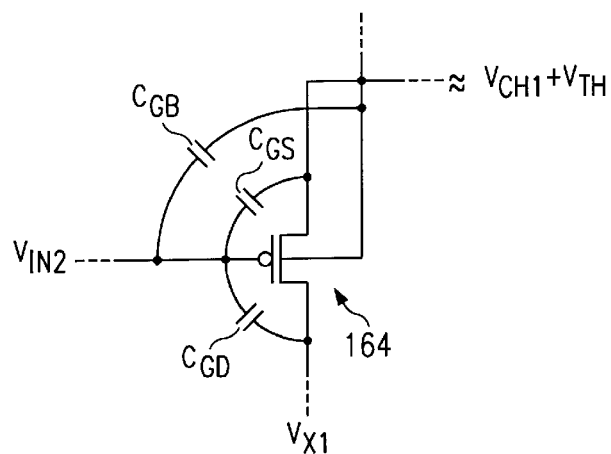
FIG. 4(b) is a diagram illustrating the parasitic capacitance generated in the MOSFET.
Figure 4C:
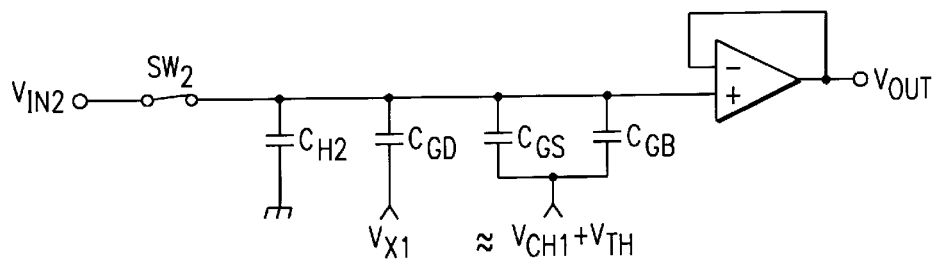
FIG. 4(c) is a diagram illustrating the relationship between the parasitic capacitance and the hold capacitor.

In FIG. 1, 2 represents the sample-and-hold circuit as an example of the present invention. Just as with sample-and-hold circuit 102 of the prior art shown in FIG. 3, it mainly comprises a differential section and an output section.

Said differential section has constant-current source 41, differential blocks 51 and 61 of the first and second systems, current mirror circuit 43, bias current supply circuit 3, selector 4, and potential adjuster 5. The structure is such that sampling/holding can be performed for sampling voltages $V_{in1}$ and $V_{in2}$ of the two systems by means of differential blocks 51 and 61 of the first and second systems.

On the other hand, the output section has constant-current source 42 and output transistor 47. The constitution is such that the output from one of differential blocks 51 and 61 of the first and second systems can be output from the output terminal of output transistor 47 with constant-current source 42 as the load.

Bias current supply circuit 3 has constant-current sources 11 and 21. It contains said constant-current sources 41 and 42. Power source voltage $V_{ee}$ is applied to the source terminal of each p-channel MOSFET. Constant voltage $V_{bias}$ is applied to the gate terminal. Consequently, currents determined by the value of constant voltage $V_{bias}$ and the channel length and channel width of the p-channel MOSFET flow from the drain terminals of constant-current sources 11, 21, 41, and 42, respectively.

Differential blocks 51 and 61 of the first and second system have switches 52 and 62 and differential circuits 53 and 63, respectively.

Switches 52 and 62 comprise p-channel MOSFETs, respectively. Differential circuit 53 of the first system has its source terminal made of common p-channel MOSFETs 54 and 55. Differential circuit 63 of the second system has the source terminal made of common p-channel MOSFETs 64 and 65.

On the other hand, switches 12 and 22 are arranged. Differential circuits 53 and 63 of the first and second systems are connected through switches 12 and 22 to constant-current sources 11 and 21, respectively. At the same time, they are connected through switches 52 and 62 to the same constant-current source 41.

Switches 12 and 22 in bias current supply circuit 3 comprise p-channel MOSFETs, with the gate terminals grounded. Switches 12 and 22 are normally in the on state, and normally constant currents are fed from constant current sources 11 and 21 to differential circuit 53 and 63, respectively.

$XSEL_1$ signal and $XSEL_2$ signal having complementary (opposite) logic states are input to the gate terminals of switches 52 and 62 in first and second differential blocks 51 and 61, respectively, and either switch 52 or switch 62 turns on. Consequently, from constant-current source 41, constant current is fed to either differential circuit 53 or differential circuit 63.

Differential blocks 51 and 61 of the first and second systems are connected through selector 4 to current mirror circuit 43 and potential adjuster 5.

Current mirror circuit 43 has n-channel MOSFETs 44 and 45. The gate terminals of n-channel MOSFETs 44 and 45 are interconnected, and the gate and drain of n-channel MOSFET 45 are short-circuited. Said two n-channel MOSFETs 44 and 45 have their source terminals connected to ground. The constitution is such that the current flowing through n-channel MOSFET 45 has the same magnitude as that flowing through n-channel MOSFET 44.

Potential adjuster 5 has n-channel MOSFETs 19 and 29 with the source terminals connected to ground, and with gate and drain of each short-circuited. When a current of the same magnitude as that which flows through n-channel MOSFETs 44 and 45 of current mirror circuit 43 flows through each of n-channel MOSFETs 19 and 29, the potential at the drain terminals of n-channel MOSFETs 19 and 29 becomes the same as the potential at the drain terminals of n-channel MOSFETs 44 and 45.

Selector 4 has switches 16–18 and switches 26–28. n-channel MOSFETs 44 and 45 that form current mirror circuit 43 are connected through switches 16 and 17 to p-channel MOSFETs 54 and 55 that form differential circuit 53 of the first system through switches 16 and 17, respectively. At the same time, they are connected through switches 26 and 27 to p-channel MOSFETs 64 and 65 that form differential circuit 63 of the second system, respectively. Also, n-channel MOSFETs 19 and 29 in potential adjuster 5 are connected through switches 18 and 28 to p-channel MOSFETs 54 and 64, respectively.

Hold capacitors $C_{H1}$ and $C_{H2}$ are set in differential blocks 51 and 61 of the first and second systems. The constitution is such that sample voltages $V_{in1}$ and $V_{in2}$ are applied via switches $SW_1$ and $SW_2$ to one end of hold capacitor $C_{H1}$ and one end of hold capacitor $C_{H2}$, respectively. The other ends of hold capacitors $C_{H1}$ and $C_{H2}$ are connected to the gate terminals of p-channel MOSFETs 54 and 64, each of which represents one side of differential circuits 53 and 63 of the first and second systems. When charging/discharging is performed at sample voltages $V_{in1}$ and $V_{in2}$ applied to hold capacitors $C_{H1}$ and $C_{H2}$, the voltages of hold capacitors $C_{H1}$ and $C_{H2}$ are applied to the gate terminals of p-channel MOSFETs 54 and 64.

Output voltage $V_{out}$ of output transistor 47 is input to the gate terminals of other p-channel MOSFETs 55 and 65 in differential circuits 53 and 63 of the first and second systems. Said output transistor 47 is an n-channel MOSFET. Its source terminal is connected to a ground, and its drain terminal is connected to the drain terminal of constant-current terminal 42. Also, the gate terminal is connected to the drain terminal of n-channel MOSFET 44 of current mirror circuit 43.

By means of the aforementioned connections, an amplifier comprises constant-current sources 11, 21, 41, 42, differential blocks 51, 61, current mirror circuit 43, and output transistor 47. The gate terminals of p-channel MOSFETs 54 and 64, each of which represents one side of differential circuits 53, 63, become the noninverting input terminal of the amplifier, while the gate terminals of the other p-channel MOSFETs 55 and 65 become the inverting input terminal. Also, as output voltage $V_{out}$ is directly input to the inverting input terminal, when either differential block 51 or differential block 61 operates, the amplifier made of this differential block becomes a voltage follower of the voltage input to the gate terminal of p-channel MOSFET 54 or p-channel MOSFET 64 that forms the noninverting input terminal.

Which of the differential blocks is to function is determined by switching depending on the logic states of signal $SEL_1$, signal $SEL_2$, signal $XSEL_1$, and signal $XSEL_2$ input from the outside. Signal $SEL_1$ and signal $SEL_2$ have inverted (complementary) logic states by means of an external circuit. Also, signal $XSEL_1$ and signal $XSEL_2$ have inverted (complementary) logic states. In addition, both signal $SEL_1$ and signal $XSEL_1$ have inverted (complementary) logic states.

Signal $SEL_1$ and signal $SEL_2$ are input to the gate terminals of switches 16 and 17 and switches 26 and 27, respectively. Also, signal $XSEL_1$ and signal $XSEL_2$ are input to the gate terminals of switches 18 and 28, respectively, and to the gate terminals of said switches 52 and 62, respectively.

Figure 2:
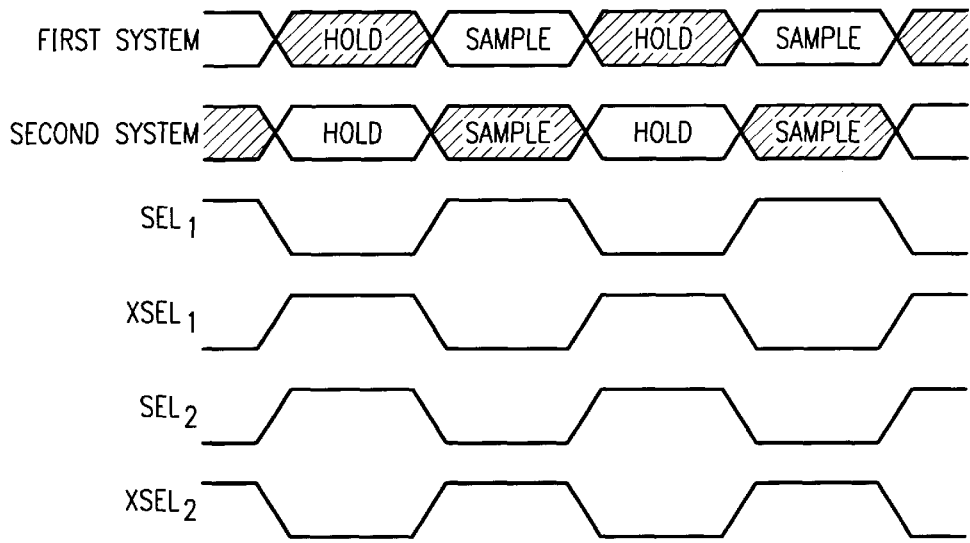
FIG. 2 is a timing diagram for explaining the operation.

FIG. 2 is a timing chart of signal $SEL_1$, signal $SEL_2$, and signals $XSEL_1$ and $XSEL_2$. When signal $SEL_1$ is low, signal $SEL_2$ is high. In this state, switches 16 and 17 are off, and switches 26 and 27 are on. Consequently, differential circuit 63 of the second system is connected to current mirror circuit 43. When said signal $SEL_1$ is low and signal $SEL_2$ is high, signal $XSEL_1$ is high and signal $XSEL_2$ is low. Consequently, switch 52 is off, switch 62 is on, and current is fed to differential circuit 63 of the second system from constant-current source 41. However, in this situation, differential circuit 53 of the first system is not connected to current mirror circuit 43, and also current is not supplied from constant-current source 41.

Consequently, differential circuit 53 of the first system does not operate. On the other hand, differential circuit 63 of the second system operates, and its p-channel MOSFETs 64 and 65 output to output transistor 47 the difference between the voltages input to the gate terminals with current mirror circuit 43 as the load.

When signal $SEL_1$ is in low, switch $SW_1$ is on and switch $SW_2$ is off. Differential block 51 of the first system is set to the sampling state, and sampling voltage $V_{in1}$ is applied to hold capacitor $C_{H1}$ of the first system. On the other hand, differential block 61 of the second system is set to the holding state (operating state), and second hold capacitor $C_{H2}$ is cut off from sampling voltage $V_{in2}$.

In this case, since there is no DC current path to second hold capacitor $C_{H2}$, the voltage of hold capacitor $C_{H2}$ is maintained, and the value of the holding voltage appearing on hold capacitor $C_{H2}$ is output as output voltage $V_{out}$ through the drain terminal of p-channel MOSFET 64 in differential block 61 of the second system in the operating state.

In this case, switches 16, 17, 52 are off, differential block 51 of the first system cannot be operated. In sampling hold circuit 2, bias current supply circuit 3 and potential adjuster 5 are set. Since signal $XSEL_1$ is high, switch 18 is on, and the drain terminal of p-channel MOSFET 54 is connected to ground through n-channel MOSFET 19 of potential adjuster 5. Also, the voltage on hold capacitor $C_{H1}$ is applied to the gate terminal of p-channel MOSFET 54. Consequently, the constant current sourced from constant-current source 11 in bias current supply circuit 3 can flow through p-channel MOSFET 54 to n-channel MOSFET 19. Consequently, p-channel MOSFET 55 of differential circuit 53 of the first system is off, and the state becomes the same as that when p-channel MOSFET 54 operates.

If the drain current of p-channel MOSFET 54 is $I_d$, and the current fed by constant-current source 11 is $I_1$ in this state, $$I_d = I_1$$

Then, the voltage to be output (hold voltage) is switched, signal $SEL_1$ goes high, $XSEL_1$ goes low, signal $SEL_2$ goes low, and signal $XSEL_2$ goes high. Switches 26 and 27 are off, and switches 16 and 17 are on. Consequently, differential block 61 is cut off from current mirror circuit 43, and differential block 51 of the first system is connected to current mirror circuit 43.

At this time, switch 18 is off and p-channel MOSFET 54 is cut off from potential adjuster 5. Also, switch 52 is on, switch 62 is off, and differential circuit 53 of the first system is connected to constant-current source 41.

When constant current $I_1$, supplied from constant-current source 41 is equal to current $I_1$ supplied from constant-current source 11, $$I_0 = I_1,$$

a current of magnitude $I_1 \times 2$ is supplied from constant-current source 41 and constant-current source 11 to differential circuit 53 in the operating state. On the other hand, the load of differential circuit 53 is current mirror circuit 43, and, in the equilibrium state, the currents flowing through p-channel MOSFETs 54 and 55 have the same magnitude. Consequently, the currents flowing through p-channel MOSFETs 54, 55 have the same magnitude, $I_1$. Consequently, in p-channel MOSFET 54, both when differential block 51 is in the sampling state and when it is in the holding state, current $I_1$ of the same magnitude flows, and the inter-terminal voltage in the sampling state is nearly equal to that in the holding state.

The following is an explanation of the potentials at the terminals of p-channel MOSFET 54. Power source voltage $V_{ee}$ is applied through switch 12 and constant-current source 11 in the sampling state. In the holding state, power source voltage $V_{ee}$ is applied via constant-current source 11 to switch 12, and, at the same time, power source voltage $V_{ee}$ is applied via switch 52 and constant-current source 41.

Since the current flowing through p-channel MOSFET 54 in the sampling state and that in the holding state have the same magnitude $I_1$, if the p-channel MOSFETs that form constant-current sources 11 and 41 have the same channel length and channel width, and the p-channel MOSFETs that form switches 12 and 52 have the same channel length and channel width, the voltage drop between constant-current source 11 and switch 12 and the voltage drop between constant-current source 41 and switch 52 are nearly equal. Consequently, the potential of the source terminal of p-channel MOSFET 54 in the sampling state is nearly equal to that in the holding state reached after the transition from the sampling state.

Also, in the sampling state, the drain terminal of p-channel MOSFET 54 is connected to ground via switch 18 and n-channel MOSFET 19 in the sample state, and it is connected to ground through switch 16 and n-channel MOSFET 44 in the holding state.

Consequently, when the n-channel MOSFETs that form switches 18 and 16 have the same channel length and channel width, and the n-channel MOSFETs 19 and 44 have the same channel length and channel width, the voltage drop of switch 18 and n-channel MOSFET 19 is nearly equal to the voltage drop of switch 16 and n-channel MOSFET 44. Consequently, the potential of the drain terminal of p-channel MOSFET 54 in the sampling state is nearly equal to that in the holding state reached by the transition from the sampling state.

Also, since, as described above, the back gate of said p-channel MOSFET 54 is short-circuited to the source terminal, the potential of the source terminal and drain terminal in the sampling state is nearly equal to that in the holding state. Consequently, when a transition from the sampling state to the holding state occurs, charging/discharging of parasitic capacitors $C_{GD}$, $C_{GS}$, and $C_{GB}$ are small, and correct sample-and-hold operation can be performed.

In the above, the potential relationship has been explained with respect to p-channel MOSFET 54 in differential block 51 of the first system. The same is true for p-channel MOSFET 64 in differential block 61 of the second system. When a transition from the sampling state to the holding state takes place for differential block 61 of the second system, current flows through hold capacitor $C_{H2}$ due to the charging/discharging of the parasitic capacitance of p-channel MOSFET 64.

The constitution of the present invention is not limited to the output stage of the sample-and-hold circuit being comprised of constant-current source 42 and output transistor 47. Other configurations may also be adopted. Also, the present invention is not limited to the case in which the MOSFET connected to the hold capacitor is a p-channel MOSFET. It may also be an n-channel MOSFET.

Sample-and-hold circuit 2 has two systems of differential blocks 51 and 61. However, when there is one differential block, as described above, it is also possible to prevent charging/discharging of the parasitic capacitance of the MOSFET with the hold capacitor connected to the gate terminal. It is thus possible to realize correct sample-and-hold operation.

Also, the present invention is used in the same way for the sample-and-hold circuit having three or more systems of differential blocks, and it is possible to perform the sample-and-hold operation free of influence of parasitic capacitance.

Switches 12 and 22 of said sample-and-hold circuit 2 are set to compensate for the voltage drop generated in switches 52 and 62 to ensure a constant source potentials of p-channel MOSFETs 54 and 64 in both the sampling state and the holding state. However, there is no need to have switches 12 and 22 always on.

For example, if switch 12 is turned on immediately before switch $SW_1$ is turned off, and if switch 22 is turned on immediately before switch $SW_2$ is turned off, the source potential remains constant for p-channel MOSFETs 54 and 64 in the case of transition of the differential blocks from the sampling state to the holding state. Consequently, it is possible to prevent charging/discharging of the parasitic capacitors. In this case, since no current is sourced from constant-current sources 11, 21 at least in the former half period of the sampling state, the power consumption can be reduced. This is advantageous.

Switches 12 and 22 can be controlled by controlling the voltage applied to the gate terminals of the p-channel MOSFETs that form switches 12 and 22.

When transition takes place from the sampling state to the holding state, the voltage of the hold capacitor is not influenced by the parasitic capacitance.

Consequently, it is possible to perform the sample-and-hold operation correctly.

I claim:

1. A sample-and-hold circuit comprising:
a hold capacitor;
a first MOSFET have a gate terminal and first and second terminals, said gate terminal being connected to one terminal of said hold capacitor;
a switch coupled to said hold capacitor for coupling a signals to be sampled to said capacitor in a sample state and for disconnecting said capacitor from said signal to be sampled in a hold state;
a transition control circuit coupled to said first MOSFET for maintaining interterminal voltage of said first MOSFET in said sample state to be substantially equal to said interterminal voltage of said first MOSFET in said hold state whereby voltages across parasitic capacitances of said first MOSFET do not substantially change the sampled signal, wherein said transition control circuit comprises a first and a second constant current source coupled to the terminal of said first MOSFET and a first and a second load coupled to a second terminal of said first MOSFET.

2. The sample-and-hold circuit of claim 1 wherein said first constant current source is always connected to said one terminal of said first MOSFET.

3. The sample-and-hold circuit of claim 2 further comprising a plurality of hold capacitors, each hold capacitor being coupled to the first MOSFET and each having a switched coupled to its respective capacitor, each of said plurality of being operable in said sample mode during a first time period and being operable in a hold mode during a second time period.

4. The sample-and-hold circuit of claim 1 wherein said transition control circuit comprises a switching circuit for switching said second constant current source in parallel with said first constant current source.

5. The sample-and-hold circuit of claim 4 wherein said first and second constant current sources are substantially of the same magnitude.

6. The sample-and-hold circuit of claim 5 further comprising a plurality of hold capacitors, each hold capacitor being coupled to and each having a switched coupled to its respective capacitor, each of said plurality of being operable in said sample mode during a first time period and being operable in a hold mode during a second time period.

7. The sample-and-hold circuit of claim 4 wherein said switching circuit switches a load coupled to said first MOSFET between a potential adjustment circuit and a current mirror used to drive an output transistor.

8. The sample-and-hold circuit of claim 7 further comprising a second MOSFET forming a differential pair of transistors with said first MOSFET, said first MOSFET being coupled to said potential adjustment circuit, said second MOSFET being coupled to said current mirror, said first MOSFET being operable in said sample state, said first and second MOSFET being operable in said hold state, whereby current flowing in said first MOSFET is substantially identical in either said sample or said hold state.

9. The sample-and-hold circuit of claim 8 further comprising an always-on switch coupled between said first constant current source and said first MOSFET.

10. The sample-and-hold circuit of claim 9 wherein a voltage drop between said first constant current source and said first MOSFET is substantially equal to the voltage drop between said second constant current source and said first MOSFET.

11. The sample-and-hold circuit of claim 10 wherein said switching circuit comprises a third MOSFET for switching said second constant current source and said always-on switch comprises a fourth MOSFET, said third and fourth MOSFETs having substantially the same channel length and channel width.

12. The sample-and-hold circuit of claim 11 further comprising a plurality of hold capacitors, each hold capacitor being coupled to a first MOSFET and each having a switched coupled to its respective capacitor, each of said plurality of being operable in said sample mode during a first time period and being operable in a hold mode during a second time period.

13. The sample-and-hold circuit of claim 8 wherein said first MOSFET is coupled to said potential adjustment circuit by a fifth MOSFET and said second MOSFET is coupled to said current mirror by a sixth MOSFET; said potential adjustment circuit comprising a seventh MOSFET and said current mirror comprising an eight MOSFET; said first and sixth MOSFETs having substantially the same channel length and width, a voltage drop across said fifth and sixth MOSFETs being substantially the same; said seventh and eighth MOSFETs having substantially these same channel length and width, a voltage drop across said seventh and eighth transistors being substantially the same.

14. The sample-and-hold circuit of claim 13 further comprising a plurality of hold capacitors, each hold capacitor being coupled to a first MOSFET and each having a switched coupled to its respective capacitor, each of said plurality of being operable in said sample mode during a first time period and being operable in a hold mode during a second time period.

15. The sample-and-hold circuit of claim 8 further comprising a plurality of hold capacitors, each hold capacitor being coupled to a first MOSET and each having a switched coupled to its respective capacitor, each of said plurality of being operable in said sample mode during a first time period and being operable in a hold mode during a second time period.

16. The sample-and-hold circuit of claim 9 further comprising a plurality of hold capacitors, each hold capacitor being coupled to a first MOSET and each having a switched coupled to its respective capacitor, each of said plurality of being operable in said sample mode during a first time period and being operable in a hold mode during a second time period.

17. The sample-and-hold circuit of claim 10 further comprising a plurality of hold capacitors, each hold capacitor being coupled to a first MOSFET and each having a switched coupled to its respective capacitor, each of said plurality of being operable in said sample mode during a first time period and being operable in a hold mode during a second time period.

18. The sample-and-hold circuit of claim 7 further comprising a plurality of hold capacitors, each hold capacitor being coupled to a first MOSET and each having a switched coupled to its respective capacitor, each of said plurality of being operable in said sample mode during a first time period and being operable in a hold mode during a second time period.

19. The sample-and-hold circuit of claim 4 further comprising a plurality of hold capacitors, each hold capacitor being coupled to a first MOSET and each having a switched coupled to its respective capacitor, each of said plurality of being operable in said sample mode during a first time period and being operable in a hold mode during a second time period.

20. The sample-and-hold circuit of claim 1 further comprising a plurality of hold capacitors, each hold capacitor being coupled to the first MOSFET and each having a switched coupled to its respective capacitor, each of said plurality of being operable in said sample mode during a first time period and being operable in a hold mode during a second time period.

21. The sample-and-hold circuit of claim 1 further comprising a plurality of hold capacitors, each hold capacitor being coupled to the first MOSFET and each having a switched coupled to its respective capacitor, each of said plurality of being operable in said sample mode during a first time period and being operable in a hold mode during a second time period.

* * * * *